(12) United States Patent
Rigelsford

(10) Patent No.: US 11,476,951 B2
(45) Date of Patent: Oct. 18, 2022

(54) OPTICAL COMMUNICATIONS IN A BATTERY PACK

(71) Applicant: SENSATA TECHNOLOGIES, INC., Attleboro, MA (US)

(72) Inventor: Jonathan M. Rigelsford, Sheffield (GB)

(73) Assignee: SENSATA TECHNOLOGIES, INC., Attleboro, MA (US)

( * ) Notice: Subject to any disclaimer, the term of this patent is extended or adjusted under 35 U.S.C. 154(b) by 0 days.

(21) Appl. No.: 16/799,409

(22) Filed: Feb. 24, 2020

(65) Prior Publication Data

US 2021/0266075 A1    Aug. 26, 2021

(51) Int. Cl.
*H04B 10/00* (2013.01)
*H04B 10/80* (2013.01)
*G01R 31/36* (2020.01)
*H01M 10/42* (2006.01)
*H04B 10/50* (2013.01)

(52) U.S. Cl.
CPC ......... *H04B 10/80* (2013.01); *G01R 31/3644* (2013.01); *H01M 10/4285* (2013.01); *H04B 10/502* (2013.01); *H01M 2010/4271* (2013.01)

(58) Field of Classification Search
CPC ...... H01M 2010/4271; H01M 10/4285; H04B 10/80; H04B 10/502; G01R 31/3644; H04J 14/00
See application file for complete search history.

(56) References Cited

U.S. PATENT DOCUMENTS

| 7,039,322 B1* | 5/2006 | Yoshimura | H04B 10/502 428/394 |
| 2008/0212981 A1* | 9/2008 | Yamada | H04B 10/1141 398/202 |
| 2010/0067919 A1* | 3/2010 | Ono | H04B 10/116 398/172 |
| 2011/0158657 A1* | 6/2011 | Nunes | H04B 10/6931 398/202 |
| 2011/0302616 A1* | 12/2011 | Mizukami | H04B 10/116 725/76 |
| 2012/0016544 A1* | 1/2012 | Pariseau | B60L 3/0038 701/22 |

(Continued)

FOREIGN PATENT DOCUMENTS

| CN | 209266526 U | 8/2019 |
| JP | H08116309 | * 5/1996 |

(Continued)

OTHER PUBLICATIONS

Mathias Hermann, "Packaging-Material Review", Feb. 2015, AIP Conference Proceedings, p. 128 (Year: 2015).*

(Continued)

*Primary Examiner* — Pranesh K Barua
(74) *Attorney, Agent, or Firm* — Mark H. Williams

(57) ABSTRACT

In a particular embodiment, optical communications in a battery pack is disclosed that includes generating, by a module monitoring system of a battery management system, sensor data; encoding, by the module monitoring system, the sensor data into an optical signal; sending, by the module monitoring system, to a data aggregator, the sensor data as the optical signal; and decoding, by the data aggregator, the optical signal into the sensor data.

10 Claims, 8 Drawing Sheets

(56) References Cited

U.S. PATENT DOCUMENTS

| | | | | |
|---|---|---|---|---|
| 2014/0092375 | A1* | 4/2014 | Raghavan | H01M 10/48 |
| | | | | 356/32 |
| 2014/0346873 | A1* | 11/2014 | Colangelo | H02J 7/0021 |
| | | | | 307/29 |
| 2014/0365792 | A1* | 12/2014 | Yun | H01M 10/425 |
| | | | | 713/320 |
| 2015/0104673 | A1* | 4/2015 | de Greef | H04L 12/40006 |
| | | | | 429/7 |
| 2015/0318724 | A1* | 11/2015 | Brockman | H01M 10/488 |
| | | | | 320/152 |
| 2015/0318725 | A1* | 11/2015 | Brockman | H01M 10/482 |
| | | | | 340/636.1 |
| 2016/0028129 | A1* | 1/2016 | Raghavan | H01M 10/4257 |
| | | | | 429/90 |
| 2016/0359558 | A1* | 12/2016 | Baggen | H05B 47/19 |
| 2017/0351561 | A1* | 12/2017 | Yamazoe | H01M 10/42 |
| 2019/0229376 | A1* | 7/2019 | Petrakivskyi | G01R 31/3835 |
| 2019/0229518 | A1* | 7/2019 | Ronne | H04B 10/61 |
| 2019/0242949 | A1* | 8/2019 | Lemkin | H04Q 9/04 |
| 2019/0379497 | A1* | 12/2019 | Aquilano | H04W 76/15 |
| 2020/0106278 | A1* | 4/2020 | Sung | H02J 7/025 |
| 2020/0127489 | A1* | 4/2020 | Chen | G01R 31/3648 |
| 2020/0164767 | A1* | 5/2020 | Woeste | H01M 10/4257 |

FOREIGN PATENT DOCUMENTS

| | | |
|---|---|---|
| WO | 2018005631 A1 | 1/2018 |
| WO | 2018035609 A1 | 3/2018 |

OTHER PUBLICATIONS

International Search Report and Written Opinion, PCT/US2021/015203, dated May 11, 2021, 10 pages.

\* cited by examiner

Generate, By A Module Monitoring System Of A Battery Management System, Sensor Data 402

Encode, By The Module Monitoring System, The Sensor Data Into An Optical Signal 404

Send, By The Module Monitoring System, To A Data Aggregator The Sensor Data As The Optical Signal 406

Decode, By The Data Aggregator, The Optical Signal Into The Sensor Data 408

FIG. 4

```
┌─────────────────────────────────────────────────────────────────────────┐
│  Generate, By A Module Monitoring System Of A Battery Management        │
│  System, Sensor Data                                                    │
│                              402                                        │
└─────────────────────────────────────────────────────────────────────────┘
                                    │
                                    ▼
┌─────────────────────────────────────────────────────────────────────────┐
│  Encode, By The Module Monitoring System, The Sensor Data Into An       │
│  Optical Signal 404                                                     │
└─────────────────────────────────────────────────────────────────────────┘
                                    │
                                    ▼
┌─────────────────────────────────────────────────────────────────────────┐
│  Send, By The Module Monitoring System, To A Data Aggregator The        │
│  Sensor Data As The Optical Signal 406                                  │
│                                                                         │
│    ┌───────────────────────────────────────────────────────────────┐    │
│    │  Output, By The Module Monitoring System, An Unfocused        │    │
│    │  Optical Signal 502                                           │    │
│    └───────────────────────────────────────────────────────────────┘    │
└─────────────────────────────────────────────────────────────────────────┘
                                    │
                                    ▼
┌─────────────────────────────────────────────────────────────────────────┐
│  Decode, By The Data Aggregator, The Optical Signal Into The Sensor     │
│  Data 408                                                               │
└─────────────────────────────────────────────────────────────────────────┘
```

FIG. 5

```
┌─────────────────────────────────────────────────────────────────────┐
│  Generate, By A Module Monitoring System Of A Battery Management System, Sensor Data │
│                                    402                              │
└─────────────────────────────────────────────────────────────────────┘
                                    │
                                    ▼
┌─────────────────────────────────────────────────────────────────────┐
│  Encode, By The Module Monitoring System, The Sensor Data Into An Optical Signal 404 │
└─────────────────────────────────────────────────────────────────────┘
                                    │
                                    ▼
┌─────────────────────────────────────────────────────────────────────┐
│  Determine, By The Module Monitoring System, To Send The Sensor Data As The Optical │
│  Signal In Response To An Error Associated With Another Communications Path 602     │
└─────────────────────────────────────────────────────────────────────┘
                                    │
                                    ▼
┌─────────────────────────────────────────────────────────────────────┐
│  Send, By The Module Monitoring System, To A Data Aggregator The Sensor Data As The │
│                             Optical Signal 406                      │
└─────────────────────────────────────────────────────────────────────┘
                                    │
                                    ▼
┌─────────────────────────────────────────────────────────────────────┐
│     Decode, By The Data Aggregator, The Optical Signal Into The Sensor Data 408     │
└─────────────────────────────────────────────────────────────────────┘
```

FIG. 6

Generate, By A Module Monitoring System Of A Battery Management System, Sensor Data 402

Encode, By The Module Monitoring System, The Sensor Data Into An Optical Signal 404

Send, By The Module Monitoring System, To A Data Aggregator The Sensor Data As The Optical Signal 406

Decode, By The Data Aggregator, The Optical Signal Into The Sensor Data 408

Determine, By The Data Aggregator, A Pattern In Voltage Variance Associated With An Optical Receiver 702

Generate, Based On The Pattern In Voltage Variance, The Sensor Data 704

FIG. 7

Generate, By A Module Monitoring System Of A Battery Management System, Sensor Data 402

Encode, By The Module Monitoring System, The Sensor Data Into An Optical Signal 404

Send, By The Module Monitoring System, To A Data Aggregator The Sensor Data As The Optical Signal 406

Decode, By The Data Aggregator, The Optical Signal Into The Sensor Data 408

Send, By The Data Aggregator, The Sensor Data To A Vehicle Control System 802

FIG. 8

OPTICAL COMMUNICATIONS IN A BATTERY PACK

BACKGROUND

Electric vehicles are powered by high voltage battery systems including multiple cells. Battery management systems are used to monitor various attributes of the cells, including voltage, temperature, and current, in order to ensure proper and safe operation of the battery. In a conventional wired battery management system, multiple cells of the battery are grouped into modules, with each module having a component to monitor these attributes. Each of these components is wired to a central controller. Problems caused by this solution include lack of flexibility in pack design, wasted space due to connectors and cabling inside the battery pack, and increased challenges for battery second life usage. Though wireless technologies may be used to connect battery monitoring components to a central controller, these wireless technologies are vulnerable to interference from other systems or malicious parties and are also vulnerable to cyber-attacks. Wireless technologies using optical signals rely on line-of-sight optical communications, making pack configurations limited and complex.

SUMMARY

In a battery management system, a plurality of module monitoring systems may be each configured to monitor various attributes of a battery module. These attributes may be encoded as battery sensor data. Each module monitoring system may encode the battery sensor data and transmit an optical signal embodying the battery sensor data. The optical signal may be transmitted using an undirected (e.g., non-line-of-sight) light transmitter such as an Organic Light Emitting Diode. A data aggregator may receive the optical signals from the module monitoring systems and send the battery sensor data to a vehicle control system.

By using undirected optical signals, the module monitoring systems may send their battery sensor data to the data aggregator without a need for a direct line of sight. Moreover, the use of optical signals allows for battery sensor data to be transmitted without the risk of interference or attack found in radio transmissions.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIG. 4 is a flowchart to illustrate an implementation of a method for optical communications in a battery pack in accordance with the present disclosure;

FIG. 5 is a flowchart to illustrate an implementation of a method for optical communications in a battery pack in accordance with the present disclosure;

FIG. 6 is a flowchart to illustrate an implementation of a method for optical communications in a battery pack in accordance with the present disclosure;

FIG. 7 is a flowchart to illustrate an implementation of a method for optical communications in a battery pack in accordance with the present disclosure; and FIG. 8 is a flowchart to illustrate an implementation of a method for optical communications in a battery pack in accordance with the present disclosure.

DETAILED DESCRIPTION

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B, as well as A and B. An alternative wording for the same combinations is "at least one of A and B". The same applies for combinations of more than two elements.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

Figure 1:
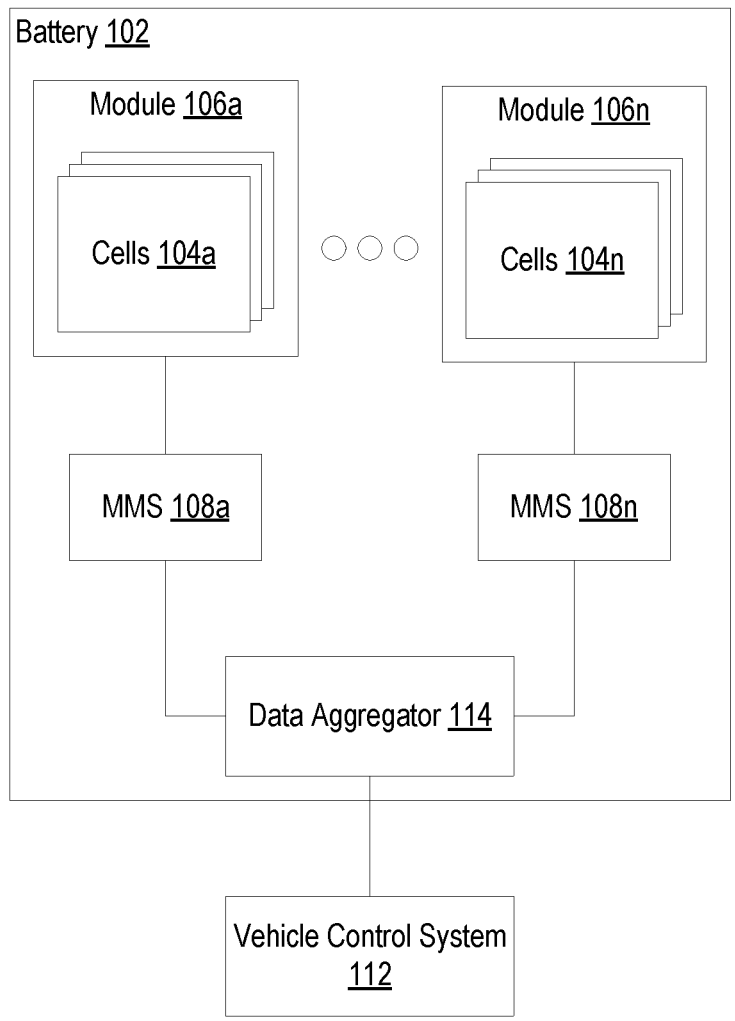
FIG. 1 sets forth a block diagram of a system for optical communications in a battery pack according to embodiments of the present disclosure.

Exemplary methods, systems, apparatuses, and computer program products for optical communications in a battery pack in accordance with the present disclosure are described with reference to the accompanying drawings, beginning with FIG. 1. FIG. 1 sets forth a diagram of a system for optical communications in a battery pack according to embodiments of the present disclosure. The system includes a battery (102), such as a high voltage battery for use in an electric vehicle. The battery (102) includes a plurality of cells (104*a-n*), such as Lithium-ion (Li-ion) cells. The cells (104*a-n*) are grouped into modules (106*a-n*) such that each module (106*a-n*) comprises a corresponding subset of the cells (104*a-n*). The cells (104*a-n*) may be physically grouped into modules (106*a-n*) using a casing, chassis, or other enclosure. The cells (104a-n) may also be logically grouped into modules (106a-n) by virtue of distinct groupings of cells (104a-n) being monitored by a distinct module monitoring system (108a-n), as will be described below.

The system also includes a plurality of module monitoring systems (MMS) (108a-n). Each MMS (108a-n) is configured to monitor a corresponding module (106a-n) of cells (104a-n). For example, each module (106a-n) may have a MMS (108a-n) attached to a chassis, base, tray, or other mechanism holding the cells (104a-n) of the module (106a-n). Each MMS (108a-n) includes sensors to measure various attributes of the cells (104a-n) of its corresponding module (106a-n). Such attributes may include voltage, current, temperature, and potentially other attributes. The attributes are indicated in battery sensor data generated by the MMS (108a-n).

Each MMS (108a-n) encodes its battery sensor data for transmission as an optical signal and transmits its battery sensor data as an optical signal to a data aggregator (114). For example, each MMS (108a-n) includes an optical transmitter such as an Organic Light Emitting Diode (OLED). The battery sensor data may be encoded into an optical signal transmitted by flashing the OLED on or off. An optical receiver of the data aggregator (114) (e.g., a light dependent resistor (LDR) or photodiode) may then receive the optical signal and convert the optical signal into data. The OLED may be configured to flash or illuminate in an undirected fashion such that the optical signal is not focused to a focal point (e.g. not focused on a photodiode or optical receiver). The optical signal may be reflected by the components in the battery (102) pack and received by the optical receiver of the data aggregator (114) without a direct line of sight. As the reflectiveness of conventional battery components (102) may be sufficient to reflect the optical signal between each MMS (108a-n) and the data aggregator (114), additional reflective coatings or surfaces may not be needed, allowing for standard battery (102) components to be used. Additional reflective coatings or surfaces may be added to components inside the battery (102) pack to improve illumination and optical signal carrying. The data aggregator (114) may then provide the battery sensor data to a vehicle control system (112).

By transmitting the battery sensor data from the MMS (108a-n) to the data aggregator (114) using an optical signal, battery sensor data transmissions are protected from radio interference, malicious attacks, or other flaws found in radio-based wireless battery management systems. Moreover, as the optical signals are sent using undirected (e.g., unfocused) light transmissions, the MMS (108a-n) do not require a direct line of sight to the data aggregator (114), increasing the flexibility of pack design configurations.

The optical communications pathways between the MMS (108a-n) and the data aggregator (114) may correspond to a secondary or alternative communications pathway. For example, the MMS (108a-n) and data aggregator (114) may be communicatively coupled using a wireless radio connection for transmitting sensor data. The MMS (108a-n) may be configured to transmit sensor data using the optical communications pathway in response to detected interference, packet loss, data corruption, or other issues with respect to the wireless radio connection.

Figure 2:
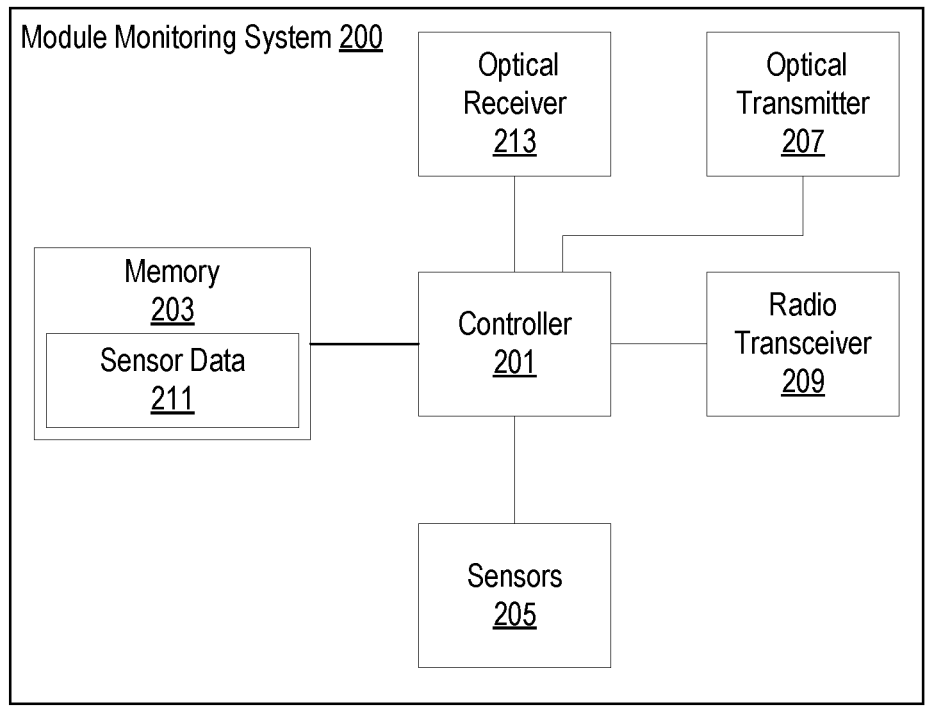
FIG. 2 illustrates a block diagram of a module monitoring system for optical communications in a battery pack according to embodiments of the present disclosure.

For further explanation, FIG. 2 sets forth a block diagram of a module monitoring system (MMS) (200) (e.g., a module monitoring system (108a-n) of FIG. 1) for optical communications in a battery pack according to embodiments of the present disclosure. The MMS (200) includes a controller (201) coupled to a memory (203). The controller (201) is configured to obtain sensor readings from sensors (205) (e.g., voltage sensors, temperature sensors, current sensors) to generate battery sensor data (211). The controller (201) may include or implement a microcontroller, an Application Specific Integrated Circuit (ASIC), a digital signal processor (DSP), a programmable logic array (PLA) such as a field programmable gate array (FPGA), or other data computation unit in accordance with the present disclosure. The battery sensor data (211) may be stored in the memory (203). The memory (203) may be a non-volatile memory such as flash memory.

The module monitoring system (200) includes an optical transmitter (207) configured to broadcast light within a battery pack. For example, the optical transmitter (207) may include a Light Emitting Diode (LED), Organic Light Emitting Diode (OLED), etc. Accordingly, the controller (201) may encode sensor data (211) into an optical signal for transmission via the optical transmitter (207). For example, the illumination state (e.g., on or off), illumination duration, delumination duration, illumination/delumination frequency, or other factors may be used to encode sensor data (211) into an optical signal. The optical transmitter (207) may be configured to emit light as unfocused or undirected light such that an optical receiver of a data aggregator (114) can detect the emitted light without line of sight. For example, the optical signal may be transmitted from the optical transmitter (207) within the battery casing by reflecting off the various components (e.g., modules, cells, inner casing) of the battery casing. The optical transmitter (207) may be configured to emit light in the blue or green portion of the spectrum, as blue or green light is less susceptible to interference caused by heat within a battery pack.

To synchronize optical transmissions and reception between module monitoring systems (200), the module monitoring system (200) may include a radio transceiver (209) and/or an optical receiver (213). For example, to transmit sensor data (211) as an optical signal, a module monitoring system (200) may send a radio signal to other module monitoring systems (200) via the radio transceiver (209) and/or send an optical signal indicating forthcoming transmission of battery sensor data (211) for receipt by optical receivers (213) of other module monitoring systems (200). In response to receiving a signal indicating forthcoming transmission of a battery signal data from another module monitoring system (200), a receiving module monitoring system (200) may suspend transmission of optical signals until it is determined that the transmission of battery sensor data is complete (e.g., via an optical or radio signal from the transmitting MMS (200)). The module monitoring systems (200) may also communicate with each other (e.g., via the radio transceiver) to determine a time window or other time sharing schema to prevent overlapping optical signal transmissions by MMSes (200).

Figure 3:
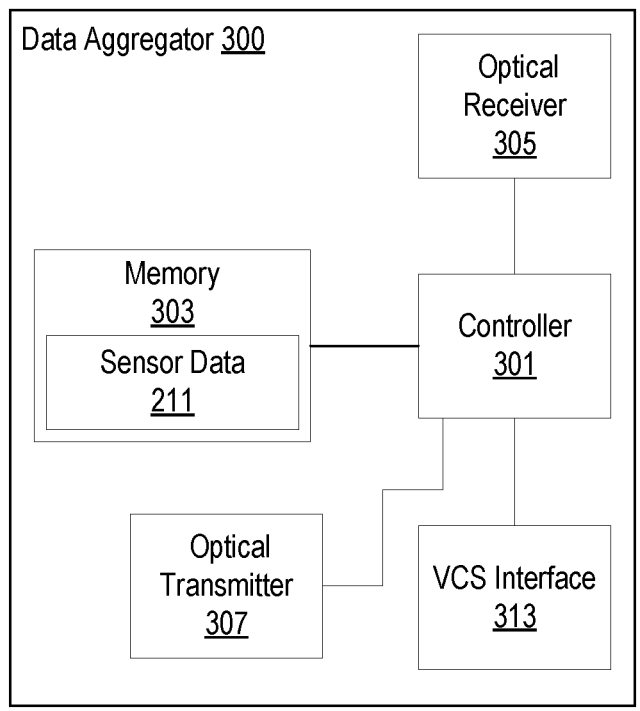
FIG. 3 illustrates a reference diagram of a data aggregator for optical communications in a battery pack according to embodiments of the present disclosure.

For further explanation, FIG. 3 sets forth a block diagram of a data aggregator (300) (e.g., a data aggregator (114) of FIG. 1) for optical communications in a battery pack according to embodiments of the present disclosure. The data aggregator (300) includes a controller (301) coupled to a memory (303). The controller (301) is configured to receive, via an optical receiver (305) from a plurality of MMSes (200), optical signals encoding sensor data (211). The optical receiver (305) may include a light dependent resistor (LDR), photodiode, phototransistor, or other light-responsive component. For example, the controller (301) may monitor voltage changes caused by the LDR being exposed to light from an optical transmitter (207) of an MMS (200). As another example, a phototransistor may be used in the optical receiver (305) for increased data rates when compared to a light dependent resistor. The optical signals received by the optical receiver (305) may be received from optical transmitters (207) without a direct line of sight to the optical receiver (305). The controller (301) may then generate sensor data (211) based on the optical signal.

The data aggregator (300) may also include an optical transmitter (307) configured to broadcast light within a battery pack. For example, the optical transmitter (307) may include a Light Emitting Diode (LED), Organic Light Emitting Diode (OLED), etc. The optical transmitter (307) may be configured to emit light as unfocused or undirected light such that the optical receivers (213) of one or more module monitoring systems (200) can detect the emitted light without line of sight. For example, the data aggregator (300) may communicate with one or more module monitoring systems (200) using optical signals to synchronize transmission of sensor data (211) by the module monitoring systems (200) (e.g., establish orderings of transmission by each MMS (200), establish time windows for transmission by each MMS (200), etc.). One skilled in the art that such synchronization operations may also be performed using other transmission mediums using other transmitters/receivers/transceivers (e.g., radio communication, wired communication, WiFi communication, etc.).

The controller (301) may include or implement a microcontroller, an Application Specific Integrated Circuit (ASIC), a digital signal processor (DSP), a programmable logic array (PLA) such as a field programmable gate array (FPGA), or other data computation unit in accordance with the present disclosure. The battery sensor data (211) may be stored in the memory (303). The memory (303) may be a non-volatile memory such as flash memory. The controller (301) is further configured to provide sensor data to a vehicle control system (e.g., a VCS (112) of FIG. 1) via a VCS interface (313). The VCS interface (313) may include a bus or other wired connection to a VCS (112).

For further explanation, FIG. 4 sets forth a flow chart illustrating an exemplary method for optical communications in a battery pack according to embodiments of the present disclosure that includes generating (402), by a module monitoring system (200) of a battery management system, sensor data (211). The sensor data (211) indicates one or more attributes of one or more cells of a module (e.g., cells (104a-n) of a module (106a-n) of FIG. 1) of a battery (e.g., a battery of an electric vehicle). The one or more attributes may include current, temperature, voltage, or other attributes. For example, the MMS (200) may use one or more sensors (205) to measure the one or more attributes and encode, using a controller (201), the measurements into battery sensor data.

The method of FIG. 4 also includes encoding (404), by the module monitoring system (200) (e.g., by a controller (201)), the sensor data (211) into an optical signal. For example, sensor data (211) may be encoded using variations in light illumination frequency, light illumination duration, light illumination intensity, or other attributes of light. The method of FIG. 4 also includes sending (406), by the MMS (200), to a data aggregator (300), the sensor data (211) as the optical signal. For example, the controller (201) of the MMS (200) may illuminate or deluminate (e.g., turn on or off) an optical transmitter (207) of the MMS (200) according to the encoding (404). The optical signal may be sent (406) by transmitting an unfocused or undirected light signal that is reflected by components within a battery casing (e.g., enclosures, chassis, etc.). The components may be off-the-shelf or conventional components without additional reflective coatings added. The components may also have reflective coatings or casings to improve light reflection within the battery casing. By using undirected light and light reflections, the MMS (200) need not have a direct line of sight to the receiving data aggregator (300).

The method of FIG. 4 also includes decoding (408), by the data aggregator, the optical signal into the sensor data (211). For example, an optical receiver (305) may detect the changes in light within a battery casing caused by sending (406) the optical signal. The optical receiver (305) may include a light dependent resistor (LDR), photodiode, phototransistor, or other light-responsive component. The controller (301) may monitor voltage or other changes caused by the optical receiver (305) being exposed to light from an optical transmitter (207) of an MMS (200). The controller may decode (408) the optical signal by converting the monitored changes into the sensor data (211) according to the encoding scheme used to encode the sensor data (211). After decoding (408) the sensor data (211), the data aggregator (300) may perform various actions on the sensor data (211). For example, the data aggregator (300) may verify or validate the sensor data (211) based on integrity data associated with the sensor data (211). As another example, the data aggregator (300) may provide the sensor data (211) to a vehicle control system via a VCS interface (313).

For further explanation, FIG. 5 sets forth a flow chart illustrating an exemplary method for optical communications in a battery pack according to embodiments of the present disclosure that includes generating (402), by a module monitoring system (200) of a battery management system, sensor data (211); encoding (404), by the module monitoring system (200) (e.g., by a controller (201)), the sensor data (211) into an optical signal; sending (406), by the MMS (200), to a data aggregator (300), the sensor data (211) as the optical signal; and decoding (408), by the data aggregator, the optical signal into the sensor data (211).

The method of FIG. 5 differs from FIG. 4 in that sending (406), by the MMS (200), to a data aggregator (300), the sensor data (211) as the optical signal includes outputting (502), by the MMS (200), an unfocused optical signal. The optical signal output by the MMS (200) is unfocused in that it is not directed to the data aggregator (300) using a line of sight. Though the MMS (200) may or may not have a direct line of sight to the data aggregator (300), a line of sight is not required. For example, the MMS (200) may output the optical signal by reflecting the optical signal off one or more surfaces within the battery pack (e.g., interior linings or walls, casings or shells of cells or battery modules, etc.). Outputting (502) the unfocused optical signal may include modulating an optical transmitter (207) based on the senor data (211). For example, the illumination state (e.g., on or off), illumination duration, delumination duration, illumination/delumination frequency, or other factors of the optical transmitter may be modulated to emit the unfocused optical signal.

For further explanation, FIG. 6 sets forth a flow chart illustrating an exemplary method for optical communications in a battery pack according to embodiments of the present disclosure that includes generating (402), by a module monitoring system (200) of a battery management system, sensor data (211); encoding (404), by the module monitoring system (200) (e.g., by a controller (201)), the sensor data (211) into an optical signal; sending (406), by the MMS (200), to a data aggregator (300), the sensor data (211) as the optical signal; and decoding (408), by the data aggregator (300), the optical signal into the sensor data (211).

The method of FIG. 6 differs from FIG. 4 in that the method of FIG. 6 also includes determining (602), by the module monitoring system (200), to send the sensor data (211) as the optical signal in response to an error associated with another communications path. For example, the module monitoring system(s) (200) may be coupled to the data aggregator (300) using another communications path such as a wired communications path or a wireless (e.g., WiFi, radio) communications path. The MMS (200) may default to or otherwise select the other communications path for sending sensor data (211) to the data aggregator (300). The data aggregator (300) may indicate, to the MMS (200), that an error has occurred with respect to the transmission of sensor data (211) via the other communications path. For example, the data aggregator (300) may determine that sensor data (211) transmitted by the other communications path has been corrupted using error detection codes, hashes, parity bits, etc. As another example, the data aggregator (300) may determine that a packet or datagram of sensor data (211) has been lost in transmission (e.g., using sequence numbers, etc.). As a further example, the data aggregator may determine that the other communications path has been compromised or is under attack by a malicious party due to failed data verification or detected wireless interference. In response to the indication from the data aggregator (300) that an error has occurred, the MMS (200) may instead send the sensor data (211) as the optical signal (e.g., using an optical communications path).

For further explanation, FIG. 7 sets forth a flow chart illustrating an exemplary method for optical communications in a battery pack according to embodiments of the present disclosure that includes generating (402), by a module monitoring system (200) of a battery management system, sensor data (211); encoding (404), by the module monitoring system (200) (e.g., by a controller (201)), the sensor data (211) into an optical signal; sending (406), by the MMS (200), to a data aggregator (300), the sensor data (211) as the optical signal; and decoding (408), by the data aggregator (300), the optical signal into the sensor data (211).

The method of FIG. 7 differs from FIG. 4 in that decoding (408), by the data aggregator (300), the optical signal into the sensor data (211) includes determining (702), by the data aggregator (300), a pattern in voltage variance associated with an optical receiver (305). The optical receiver (305) may include a light dependent resistor (LDR), photodiode, phototransistor, or other light-responsive component that experiences a change in resistance when exposed to light. Accordingly, the resistance of the optical receiver (305) changes when exposed to the optical signal encoding the sensor data (211), thereby causing a change in voltage of a circuit including the optical receiver (305). The pattern in voltage variance corresponds to the pattern of light modulation of the optical signal encoding the sensor data (211).

Decoding (408), by the data aggregator (300), the optical signal into the sensor data (211) also includes generating (704), based on the pattern in voltage variance, the sensor data (211). For example, a controller (301) of the data aggregator (300) generates sensor data based on the detected pattern in voltage variance according to an encoding scheme for converting sensor data into optical signals. The generated (704) sensor data (211) may be stored in a memory (303).

For further explanation, FIG. 8 sets forth a flow chart illustrating an exemplary method for optical communications in a battery pack according to embodiments of the present disclosure that includes generating (402), by a module monitoring system (200) of a battery management system, sensor data (211); encoding (404), by the module monitoring system (200) (e.g., by a controller (201)), the sensor data (211) into an optical signal; sending (406), by the MMS (200), to a data aggregator (300), the sensor data (211) as the optical signal; and decoding (408), by the data aggregator (300), the optical signal into the sensor data (211).

The method of FIG. 8 differs from FIG. 4 in that the method of FIG. 8 also includes sending (802), by the data aggregator (300), the sensor data (211) to a vehicle control system (e.g. a VCS (112) of FIG. 1). For example, the controller (301) may access sensor data (211) from memory (303). The controller (301) may then send the sensor data (211) to the VCS (112) via a VCS interface (313). The VCS interface (313) may include a bus or other wired connection to a VCS (112).

In view of the explanations set forth above, readers will recognize that the benefits of optical communications in a battery pack according to embodiments of the present disclosure include, but are not limited to:
  Improved space usage and configuration of batteries compared to wired battery management systems.
  Improved protections against data corruption, interference, and attacks when compared to other wireless battery management systems.
  Improved flexibility and reduced complexity in battery pack configurations when compared to optical battery management systems that require line of sight optical transmissions.

Exemplary embodiments of the present invention are described largely in the context of a fully functional computer system for optical communications in a battery pack. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, an apparatus, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present disclosure without departing from its true spirit. The descriptions in this specification are for purposes of illustration only and are not to be construed in a limiting sense. The scope of the present disclosure is limited only by the language of the following claims.

What is claimed is:

1. A method of optical communications in a battery pack, the method comprising: generating, by a module monitoring system of a battery management system, sensor data that indicates one or more attributes of one or more cells of a module;

transmitting to a data aggregator, by the module monitoring system, the sensor data via a first communication pathway between the data aggregator and the module monitoring system, wherein the first communication pathway is one of a radio frequency (RF) communication pathway and a wired communication pathway;

determining, by the module monitoring system, that the first communication pathway has been compromised or is under attack;

encoding, by the module monitoring system, the sensor data into an optical signal;

in response to determining that the first communication pathway has been compromised or is under attack, sending, by the module monitoring system, to the data aggregator, the sensor data as part of unfocused optical signal via a second communication pathway, wherein the unfocused optical signal reflects off one or more unmodified battery components inside the battery pack while traveling to the data aggregator, wherein the first communication pathway is a different type of communication pathway than the second communication pathway; wherein the second communication pathway is an optical communication pathway; and decoding, by an optical receiver of the data aggregator, the unfocused optical signal into the sensor data.

2. The method of claim 1, wherein the module monitoring system is included in a plurality of module monitoring systems, and the data aggregator is configured to receive unfocused optical signals from the plurality of module monitoring systems.

3. The method of claim 1, wherein decoding the unfocused optical signal into the sensor data comprises:

monitoring, by the data aggregator, a pattern in voltage variance associated with the optical receiver; and generating, based on the pattern in voltage variance, the sensor data.

4. The method of claim 1, further comprising sending, by the data aggregator, the sensor data to a vehicle control system.

5. The method of claim 1, wherein the data aggregator comprises one or more of a light dependent resistor (LDR), a photodiode, or a phototransistor.

6. A battery management system for optical communications in communications in a battery pack, comprising:

a data aggregator; and a module monitoring system, the module monitoring system configured to:

generate sensor data that indicates one or more attributes of one or more cells of a module;

transmit to the data aggregator, by the module monitoring system, the sensor data via a first communication pathway between the data aggregator and the module monitoring system, wherein the first communication pathway is one of a radio frequency (RF) pathway and a wired pathway;

determine, by the module monitoring system, that the first communication pathway has been compromised or is under attack; encode the sensor data into an optical signal; and in response to determining that the first communication pathway has been compromised or is under attack, send to the data aggregator, the sensor data as unfocused optical signal via a second communication pathway, wherein the unfocused optical signal reflects off one or more unmodified battery components inside the battery pack while traveling to the data aggregator, wherein the first communication pathway is a different type of communication pathway than the second communication pathway; wherein the second communication pathway is an optical communication pathway; and an optical receiver of the data aggregator configured to decode the unfocused optical signal into the sensor data.

7. The battery management system of claim 6, wherein the module monitoring system is included in a plurality of module monitoring systems, and the data aggregator is configured to receive unfocused optical signals from the plurality of module monitoring systems.

8. The battery management system of claim 6, wherein the data aggregator is configured to decode the unfocused optical signal into the sensor data, and the decoding comprises:

monitoring a pattern in voltage variance associated with the optical receiver; and generating, based on the pattern in voltage variance, the sensor data.

9. The battery management system of claim 6, wherein the data aggregator is further configured to send the sensor data to a vehicle control system.

10. The battery management system of claim 6, wherein the data aggregator comprises one or more of a light dependent resistor (LDR), a photodiode, or a phototransistor.

* * * * *